United States Patent
Hashinaga et al.

(10) Patent No.: US 11,916,519 B2
(45) Date of Patent: Feb. 27, 2024

(54) HIGH FREQUENCY AMPLIFIER

(71) Applicant: SUMITOMO ELECTRIC INDUSTRIES, LTD., Osaka (JP)

(72) Inventors: Tatsuya Hashinaga, Osaka (JP); Yutaka Moriyama, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 397 days.

(21) Appl. No.: 17/301,474

(22) Filed: Apr. 5, 2021

(65) Prior Publication Data

US 2021/0320625 A1    Oct. 14, 2021

(30) Foreign Application Priority Data

Apr. 14, 2020 (JP) .................. 2020-072400

(51) Int. Cl.
| | |
|---|---|
| H03F 1/02 | (2006.01) |
| H03F 3/21 | (2006.01) |
| H05K 1/02 | (2006.01) |
| H03K 5/01 | (2006.01) |
| H03K 5/00 | (2006.01) |

(52) U.S. Cl.
CPC ........... *H03F 1/0288* (2013.01); *H03F 3/211* (2013.01); *H03K 5/01* (2013.01); *H05K 1/0243* (2013.01); *H03F 2200/451* (2013.01); *H03K 2005/00078* (2013.01)

(58) Field of Classification Search
CPC .. H03F 1/0288; H03F 3/211; H03F 2200/451; H03K 5/01; H03K 2005/00078; H05K 1/0243

USPC .......................................................... 330/295
See application file for complete search history.

(56) References Cited

U.S. PATENT DOCUMENTS

| | | | |
|---|---|---|---|
| 2007/0164819 A1 | 7/2007 | Urata et al. | |
| 2008/0304237 A1 | 12/2008 | Shiraishi | |
| 2016/0276985 A1 | 9/2016 | Fager et al. | |
| 2016/0285420 A1* | 9/2016 | Jones | H01L 23/66 |
| 2017/0085228 A1 | 3/2017 | Abdo et al. | |
| 2020/0313624 A1* | 10/2020 | Mokhti | H03F 3/211 |

FOREIGN PATENT DOCUMENTS

| | | | | |
|---|---|---|---|---|
| JP | 2008-305937 | 12/2008 | | |
| JP | 2010-213170 | 9/2010 | | |
| JP | 2010-245819 | 10/2010 | | |
| WO | 2005/093948 | 10/2005 | | |
| WO | WO-2014029807 A1 * | 2/2014 | ........... | H03F 1/0222 |

\* cited by examiner

*Primary Examiner* — Hafizur Rahman
(74) *Attorney, Agent, or Firm* — IPUSA, PLLC

(57) ABSTRACT

A high frequency amplifier includes an asymmetrical Doherty amplifier having a carrier amplifier, a peak amplifier, a branch circuit, and a phase adjusting circuit, a driver amplifier, and a base member mounting a first circuit board mounting the driver amplifier, the carrier amplifier, and the peak amplifier and a second circuit board mounting the circuits. The branch circuit divides a path of a RF signal into input paths of the peak and carrier amplifiers. The driver amplifier, the carrier amplifier, and the peak amplifier have rear surfaces in contact with the base member. The electrical length from the output terminal of the driver amplifier to the input terminal of the peak amplifier, when converted based on a phase of the signal, is from $(2n+1)\times\pi-\alpha/4$ to $(2n+1)\times\pi+\pi/4$, where n is an integer greater than or equal to zero.

4 Claims, 9 Drawing Sheets

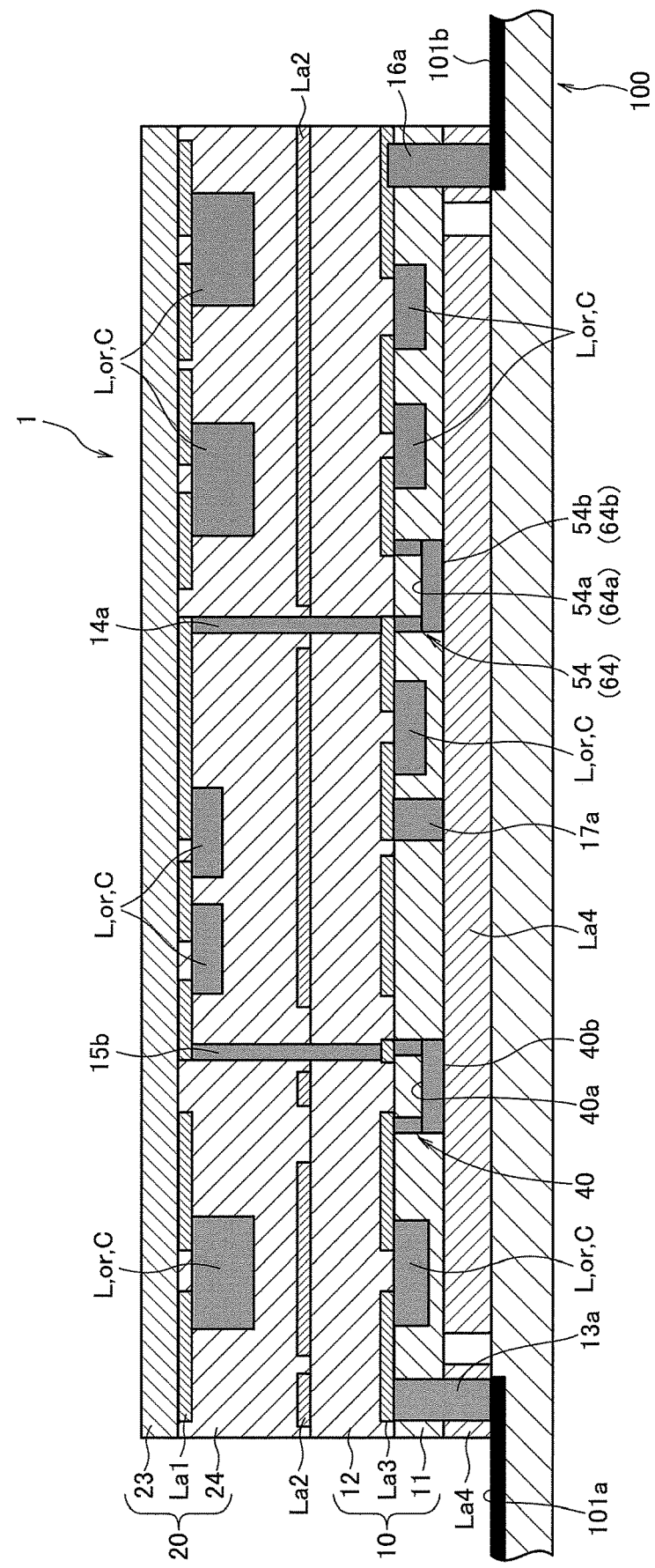

HIGH FREQUENCY AMPLIFIER

BACKGROUND OF THE INVENTION

Field of the Invention

The present disclosure relates to a high frequency amplifier.

This application claims priority based on Japanese Patent Application No. 2020-072400 filed on Apr. 14, 2020, and the entire contents of the Japanese patent application are incorporated herein by reference.

Description of the Related Art

Recent mobile communication systems for mobile phones and the like have promoted the use of wide band. For this reason, power amplifiers used for base station equipment and the like in the systems are desired to have a higher power efficiency and the like in a broad frequency band. As a power amplifier for realizing such a higher power efficiency, a Doherty amplifier having a carrier amplifier (main amplifier) and a peak amplifier is known. For example, Patent Document 1 (PCT International Publication No. WO 2005/093948) discloses a structure of the Doherty amplifier (Doherty-type amplifier). The Doherty amplifier is usually used by connecting to the subsequent stage of a driver amplifier.

Since the driver amplifier and the Doherty amplifier are mounted on a printed circuit board, a large-sized printed circuit board is used when the driver amplifier, the carrier amplifier, and the peak amplifier are mounted on the same plane. For this reason, as a measure for miniaturization and space-saving mounting of the amplifiers, there is a three-dimensional mounting method (Patent Document 2: Japanese Unexamined Patent Application Publication No. 2008-305937).

SUMMARY OF THE INVENTION

A high frequency amplifier according to an aspect of the present disclosure includes an asymmetrical Doherty amplifier that has a carrier amplifier, a peak amplifier, a branch circuit, and a phase adjusting circuit and amplifies an input high frequency signal; a driver amplifier that drives the asymmetrical Doherty amplifier; a first circuit board that mounts the driver amplifier, the carrier amplifier, and the peak amplifier; a second circuit board that mounts the branch circuit and the phase adjusting circuit; and a base member that mounts the first circuit board and the second circuit board. The peak amplifier has a saturation output different from the carrier amplifier and initiates an amplifying operation when an output of the carrier amplifier reaches a saturation region. The branch circuit divides a high frequency signal amplified by the driver amplifier into input paths of the peak amplifier and the carrier amplifier. The phase adjusting circuit is provided on at least one of the input paths of the peak amplifier and the carrier amplifier to delay at least one of phases of input signals of the peak amplifier and the carrier amplifier. The driver amplifier, the carrier amplifier, and the peak amplifier each include a front surface having a circuit thereon, and a rear surface opposite to the front surface, and each of the rear surfaces of the driver amplifier, the carrier amplifier, and the peak amplifier is in contact with the base member. The second circuit board is stacked on the first circuit board, and an input terminal of the driver amplifier and an input terminal of the peak amplifier are adjacent to each other. The electrical length from an output terminal of the driver amplifier to the input terminal of the peak amplifier, when converted based on a phase of the input high frequency signal, is from $(2n+1) \times \pi - \pi/4$ to $(2n+1) \times \pi + \pi/4$, where n is an integer greater than or equal to zero.

BRIEF DESCRIPTION OF THE DRAWINGS

FIG. 9 is a cross-sectional view schematically illustrating a high frequency amplifier according to another embodiment of the present disclosure.

DESCRIPTION OF EMBODIMENTS

Figure 1:
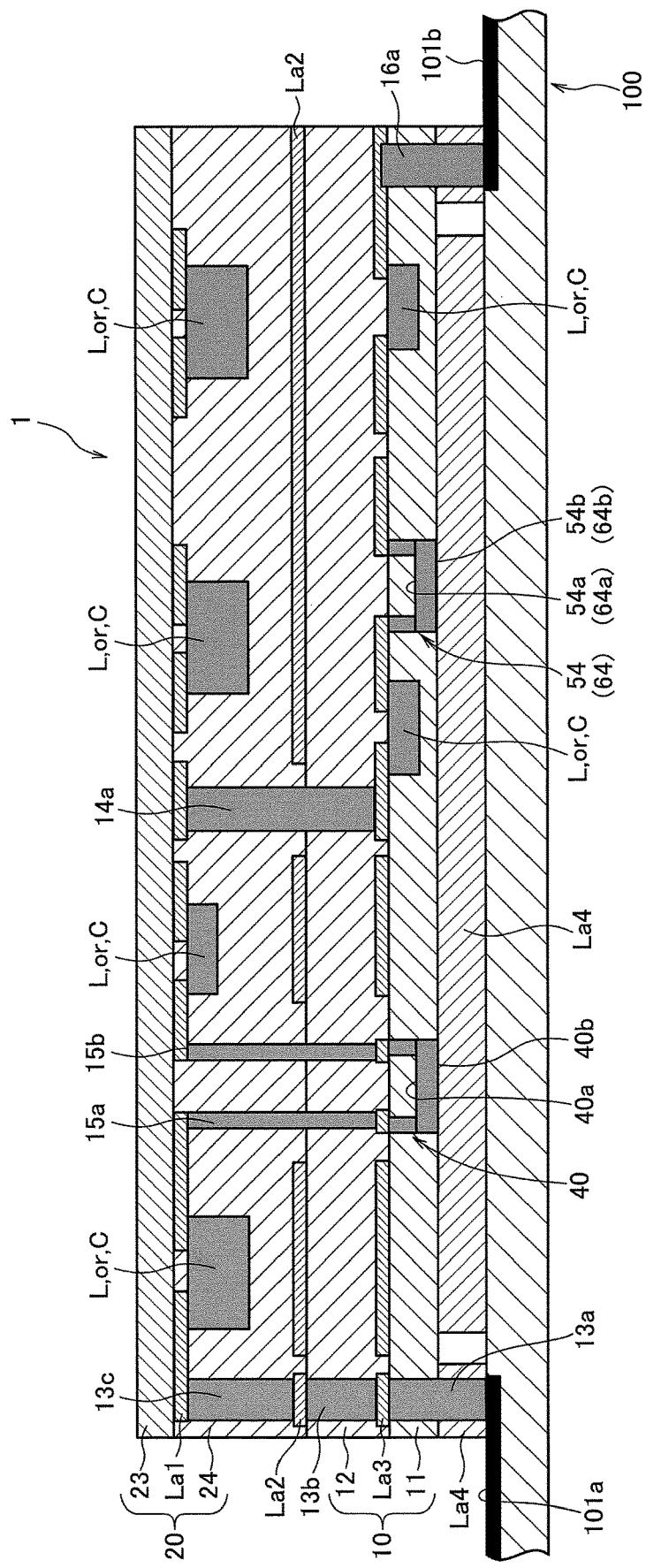
FIG. 1 is a cross-sectional view schematically illustrating a high frequency amplifier according to an embodiment of the present disclosure.

Since a high frequency amplifier (high-frequency power amplifier) disclosed in the present disclosure amplifies a high frequency input signal to a required output power, the power to be handled is large, and current consumption or power consumption is large. As a result, heat generation is large. For this reason, when heat dissipation efficiency is prioritized in the above three-dimensional mounting of the plurality of high frequency amplifiers, it is conceivable to arrange the driver amplifier, the carrier amplifier, and the peak amplifier in the lower stage and arrange the components other than the amplifiers in the upper stage. However, there is a possibility that the driver amplifier and the peak amplifier may be disposed close to each other due to restrictions on layouts, and the electric characteristics of the peak amplifier may become unstable.

In view of the above circumstances, it is an object of the present disclosure to provide a high frequency amplifier which is excellent in heat dissipation and stable.

According to the above, it is possible to provide a high frequency amplifier which is excellent in heat dissipation and stable.

DESCRIPTION OF EMBODIMENTS OF THE PRESENT DISCLOSURE

First, the contents of embodiments according to the present disclosure will be listed and described.

(1) A high frequency amplifier according to an aspect of the present disclosure includes an asymmetrical Doherty amplifier that has a carrier amplifier, a peak amplifier, a branch circuit, and a phase adjusting circuit and amplifies an input high frequency signal; a driver amplifier that drives asymmetrical Doherty amplifier; a first circuit board that mounts the driver amplifier, the carrier amplifier, and the peak amplifier; a second circuit board that mounts the branch circuit and the phase adjusting circuit; and a base member that mounts the first circuit board and the second circuit board. The peak amplifier has a saturation output different from a saturation output of the carrier amplifier and initiates an amplifying operation when an output of the carrier amplifier reaches a saturation region. The branch circuit divides a path of a high frequency signal amplified by the driver amplifier into input paths of the peak amplifier and the carrier amplifier. The phase adjusting circuit is provided on at least one of the input paths of the peak amplifier and the carrier amplifier to delay at least one of phases of input signals of the peak amplifier and the carrier amplifier. The driver amplifier, the carrier amplifier, and the peak amplifier each include a front surface having a circuit thereon and a rear surface opposite to the front surface, and each of the rear surfaces of the driver amplifier, the carrier amplifier, and the peak amplifier is in contact with the base member. The second circuit board is stacked on the first circuit board, and an input terminal of the driver amplifier and an input terminal of the peak amplifier are adjacent to each other. The electrical length from an output terminal of the driver amplifier to the input terminal of the peak amplifier, when converted based on a phase of the input high frequency signal, is from $(2n+1)\times\pi-\pi/4$ to $(2n+1)\times\pi+\pi/4$, where n is an integer greater than or equal to zero.

When the physical distance between the output terminal of the driver amplifier and the input terminal of the peak amplifier is very close, each phase of the output signals at these terminals becomes in phase, or phase close to each other, so that there is a possibility that electrically unstable states such as an oscillation occur. However, in this embodiment, since the electrical length between the two adjacent terminals (the output terminal of the driver amplifier and the input terminal of the peak amplifier) is adjusted so that the phases of the signals at these two terminals become antiphase each other, the electric characteristics of the peak amplifier are not unstable even when the driver amplifier and the peak amplifier are arranged close to each other. Therefore, it is possible to stabilize the amplifiers even when employing a two-stage structure in the high frequency amplifier. In addition, since each of the rear surfaces of the driver amplifier, the carrier amplifier, and the peak amplifier is in contact with the base member, a high frequency amplifier having an excellent heat dissipation property can be provided.

(2) In one aspect of the high frequency amplifier according to the present disclosure, the phase difference between the high frequency signal at the output terminal of the driver amplifier and the high frequency signal at the input terminal of the peak amplifier may be from $11\pi/4$ to $13\pi/4$. The electrical length between the two adjacent terminals (the output terminal of the driver amplifier and the input terminal of the peak amplifier) is set to be a phase difference ranging from of $(2n+1)\times\pi-\pi/4$ to $(2n+1)\times\pi+\pi/4$. In particular, when the phase difference between the output signal of the driver amplifier and the input signal of the peak amplifier ranges from $11\pi/4$ to $13\pi/4$, electrically unstable states such as an oscillation can be reliably solved.

(3) In one aspect of the high frequency amplifier according to the present disclosure, a grounded metal layer may be disposed between the first circuit board and the second circuit board. The grounded metal layer can block electromagnetic waves. Therefore, the first circuit board is hardly affected by the electromagnetic wave generated in the second circuit board, and the second circuit board is hardly affected by the electromagnetic wave generated in the first circuit board.

(4) In one aspect of the high frequency amplifier according to the present disclosure, the saturation output of the peak amplifier may be larger than the saturation output of the carrier amplifier. In the peak amplifier, the phase shift amount for obtaining the optimum matching is larger than the phase shift amount in the carrier amplifier.

Details of Embodiments of the Present Disclosure

Hereafter, specific examples of a high frequency amplifier according to an embodiment of the present disclosure will be described with reference to the appended drawings. FIG. 1 is a cross-sectional view schematically illustrating a high frequency amplifier according to an embodiment of the present disclosure. A high frequency amplifier 1 is mounted in a communication device such as a base station equipment of a mobile communication system, and is used to amplify transmitted signals, for example. The high frequency amplifier 1 has a base member La4. The base member La4 is a plate made of a metal (e.g., copper) which serves as both a heat dissipation member and an external terminal, and is disposed on a printed circuit board 100 of the communication device.

A lower stage 10 and an upper stage 20 are mounted on the base member La4. The lower stage 10 corresponds to the first circuit board in the present disclosure, and the upper stage 20 corresponds to the second circuit board in the present disclosure. The upper stage 20 is stacked on the lower stage 10. The upper stage 20 includes a third dielectric layer 23 (e.g., 0.1 mm in thickness), a first wiring layer La1 (e.g., 10 μm to 35 μm in thickness), and a fourth dielectric layer 24 (e.g., 0.4 mm in thickness). A high frequency line pattern is formed on the first wiring layer La1.

A second wiring layer La2 (e.g., 10 μm to 35 μm in thickness) is disposed between the fourth dielectric layer 24 and the lower stage 10 (second dielectric layer 12). The second wiring layer La2 is a solid plane made of copper, for example. The second wiring layer La2 serves as a ground plane (GND plane) for the first wiring layer La1 and also serves to shield electromagnetic waves generated between the upper stage 20 and the lower stage 10. The second wiring layer La2 corresponds to the grounded metal layer in the present disclosure. The lower stage 10 is interposed between the base member La4 and the upper stage 20. The lower stage 10 includes a second dielectric layer 12 (e.g., 0.2 mm in thickness), a third wiring layer La3 (e.g., 10 μm to 35 μm in thickness), and a first dielectric layer 11 (e.g., 0.28 mm in thickness). In the third wiring layer La3, a high-frequency line pattern is formed, where a reference voltage is set based on the base member La4 forming a ground plane (GND plane).

When manufacturing the high frequency amplifier 1, the first wiring layer La1 is first provided on one side (front surface) of the third dielectric layer 23. Next, after an inductor L and a capacitor C are mounted on one side of the first wiring layer La1, the fourth dielectric layer 24 is disposed. Subsequently, the second wiring layer La2 is provided on one side of the fourth dielectric layer 24. Then, after placing the second dielectric layer 12 on one side of this second wiring layer La2, the third wiring layer La3 is provided on one side of the second dielectric layer 12. Then, after an inductor L, a capacitor C, and active components such as a driver amplifier 40, a carrier amplifier 54 and a peak amplifier 64 are mounted on one side of the third wiring layer La3, the first dielectric layer 11 is disposed.

The driver amplifier 40 has a front surface 40a on which a predetermined circuit is formed, and a rear surface 40b which is located on the other side of the front surface 40a and does not form a circuit, for example. The driver amplifier 40 is provided in the first dielectric layer 11, and is disposed so as to face upward so that the front surface 40*a* faces upper stage 20, and is mounted on one side of the third wiring layer La3. The rear surface 40*b* is positioned to face downward so as to be away from the upper stage 20 and is fixed to the base member La4 coated with a sintered silver paste or a sintered copper paste.

The carrier amplifier 54 and the peak amplifier 64 are also provided in first dielectric layer 11, and are mounted on the one side of the third wiring layer La3 such that each of front surfaces 54*a* and 64*a* faces upward. The rear surfaces 54*b* and 64*b* are arranged to face downward so as to be in contact with the base member La4, and are fixed to the base member La4 coated with a sintered silver paste or a sintered copper paste. On one side of first dielectric layer 11, the base member La4 (e.g., 0.15 mm to 0.25 mm in thickness) serving as a ground plane (GND plane) is disposed.

For the electric path between the first wiring layer La1 in the upper stage 20 and the base member La4, signal vias 13*c*, 13*b* and 13*a* are used to secure the respective paths, for example. Specifically, the signal vias 13*a* to 13*c* penetrate the base member La4, the lower stage 10 and the fourth dielectric layer 24 in the upper stage 20. One end of the signal via 13*a* is connected to an input terminal RFin, and the other end of the signal via 13*c* is connected to the first wiring layer La1.

Further, the electric path between the first wiring layer La1 and the third wiring layer La3 in the lower stage 10 is secured using signal vias 15*a*, 15*b*, and 14*a*, for example. Specifically, first, the signal vias 15*a* and 15*b* penetrate the fourth dielectric layer 24 in the upper stage 20 and the second dielectric layer 12 in the lower stage 10. One end of the signal via 15*a* is connected to the first wiring layer La1, and the other end of the signal via 15*a* is connected to the third wiring layer La3 (input of the driver amplifier 40). On the other hand, one end of the signal via 15*b* is connected to the third wiring layer La3 (output of the driver amplifier 40), and the other end of the signal via 15*b* is connected to the first wiring layer La1.

In addition, the signal via 14*a* also penetrates the fourth dielectric layer 24 in the upper stage 20 and the second dielectric layer 12 in the lower stage 10. One end of the signal via 14*a* is connected to the first wiring layer La1 and the other end of the signal via 14*a* is connected to the third wiring layer La3 (inputs of the carrier amplifier 54 and the peak amplifier 64). Then, the electric path between the third wiring layer La3 and the base member La4 is secured using signal vias 13*a* and 16*a*, for example. Specifically, the signal vias 13*a* and 16*a* penetrate the first dielectric layer 11 in the lower stage 10 and the base member La4. One end of the signal via 16*a* is connected to the output of a Doherty amplifier 50 through the third wiring layer La3, and the other end of the signal via 16*a* is connected to an output terminal RFout.

Thus, the upper stage 20 is stacked on the lower stage 10 to three-dimensionally mount the Doherty amplifier 50 and an amplifier circuit including the driver amplifier 40. For this reason, it is possible to achieve a miniaturization of the high frequency amplifier 1 such as a module size of 2.2 mm in thickness and 6 mm square in outermost shape. In this high frequency amplifier 1, no wire bonding is required. Therefore, a large panel of, for example, about 500 mm square can be handled in the manufacturing process. Since 6,000 sheets having a size of 6 mm square, for example, can be obtained from this panel, a significant reduction in costs can be achieved by reducing processing cost and material cost.

Here, the driver amplifier 40, the carrier amplifier 54 and the peak amplifier 64 are all arranged in the lower stage 10, the output terminal of the driver amplifier 40 and the input terminal of the peak amplifier 64 are located at positions adjoining each other. As a result, the physical distance between the output terminal of the driver amplifier 40 and the input terminal of the peak amplifier 64 may be very close. In such a physical arrangement, when the respective phases of the output signal and the input signal at these two terminals become in phase, or phases close to each other, there is a possibility that electrically unstable states such as an oscillation occur.

Therefore, in the high frequency amplifier 1, the electrical length between the output terminal of the driver amplifier 40 and the input terminal of the peak amplifier 64 is adjusted so that the phases of the signals at these two terminals become antiphase each other. The electrical length from the output terminal of the driver amplifier 40 to the input terminal of the peak amplifier 64, or the delay time with which an input signal of a wavelength λ propagates from the output terminal of the driver amplifier 40 to the input terminal of the peak amplifier 64, when converted based on the phase of the input high frequency signal having a wavelength λ, is set to be from $(2n+1) \times \pi - \pi/4$ to $(2n+1) \times \pi + \pi/4$, where n is an integer greater than or equal to zero.

Figure 3:
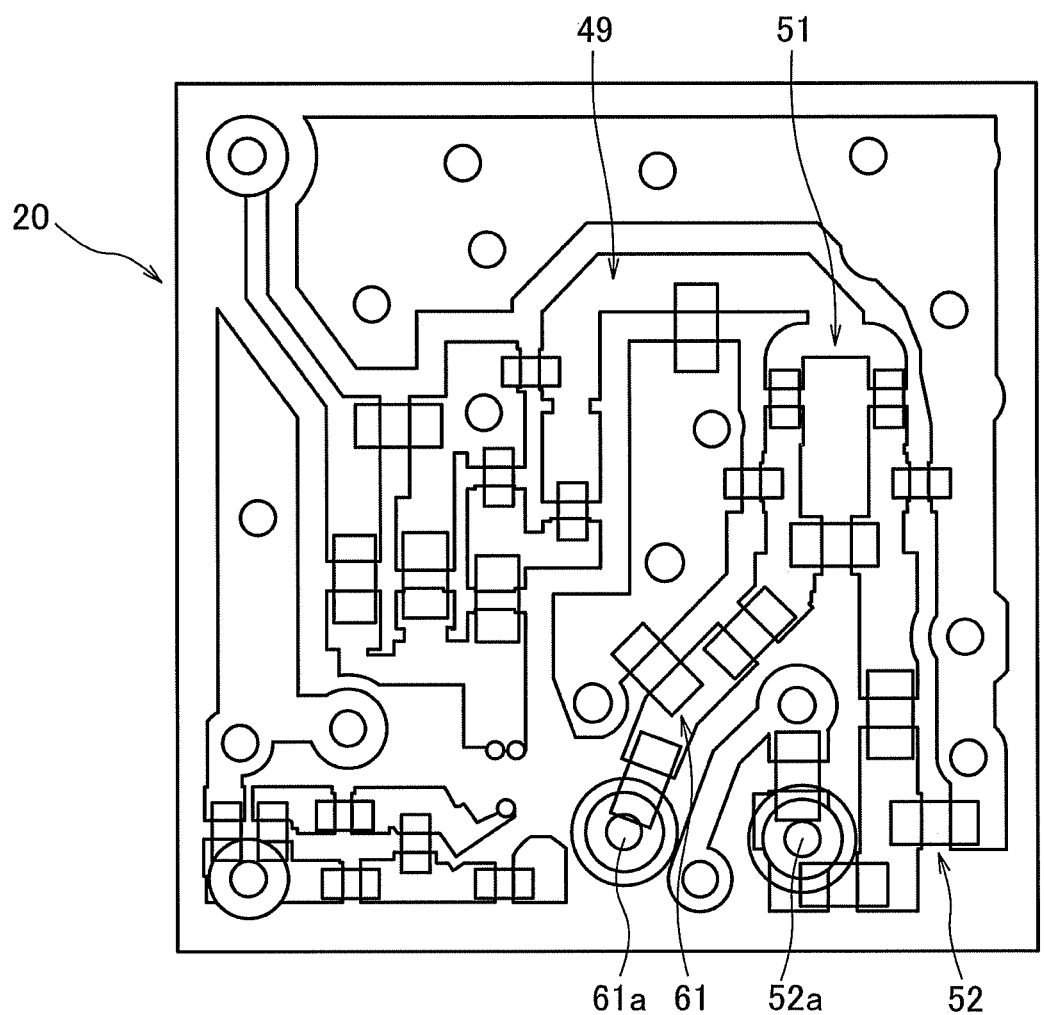
FIG. 3 is a plan view of the upper stage of FIG. 1.

In order to achieve the above conditions, the high frequency amplifier 1 may have the following configurations, for example. The path from a drain output of the driver amplifier 40 to a branch circuit 51 is largely diverted from the center to the right half of the upper stage 20, as shown by a curved pattern 49 in FIG. 3. A phase adjusting circuit 61 is arranged between the branch circuit 51 and the peak amplifier 64. The path from the output of the branch circuit 51 to a via 61*a*, as shown by a curved pattern in the vicinity of the phase adjusting circuit 61 in FIG. 3, is formed by curves instead of straight lines. The phase adjusting circuit 52 is arranged between the branch circuit 51 and the carrier amplifier 54.

In this manner, the electrical length between the two adjacent terminals, such as the output terminal of the driver amplifier 40 and the input terminal of the peak amplifier 64, is adjusted so that the phases of the signals at the two adjacent terminals are antiphase each other. Therefore, even when the driver amplifier 40 and the peak amplifier 64 are arranged close to each other, the electric characteristics of the peak amplifier 64 do not become unstable. Therefore, it is possible to stabilize the high frequency amplifier 1 even when employing a two-stage structure. More specifically, the phase difference between the high frequency signal, hereinafter referred to as the RF (Radio Frequency) signal, at the output terminal of the driver amplifier 40 and the RF signal at the input terminal of the peak amplifier 64 is set to be from $11\pi/4$ to $13\pi/4$. Thus, it is possible to reliably eliminate electrically unstable states such as an oscillation.

In a typical Doherty amplifier, the phase difference between a carrier amplifier and a peak amplifier is set to be $\pi/2$, whereas in the high frequency amplifier 1, the phase difference is intentionally set to be $\pi$. That is, the phase difference between the RF signal at the output terminal of the carrier amplifier 54 and the RF signal at the output terminal of the peak amplifier 64 is from $\pi/2$ to $3\pi/2$. As a result, the electromagnetic wave emitted from the carrier amplifier 54 and the electromagnetic wave emitted from the peak amplifier 64 cancel each other in the neighborhood, so that the electromagnetic waves emitted to the outside of the high frequency amplifier 1 can be suppressed to be small. The phases of the RF signals of the carrier amplifier 54 and the peak amplifier 64 are synchronized at the output terminal RFout using the phase adjusting circuits 52 and 61 shown in FIG. 3, input matching circuits 53 and 63 shown in FIGS. 7 and 8, output matching circuits 55 and 65, and a transmission line TRL1 (90-degree transmission line 56a shown in FIG. 4).

Figure 2:
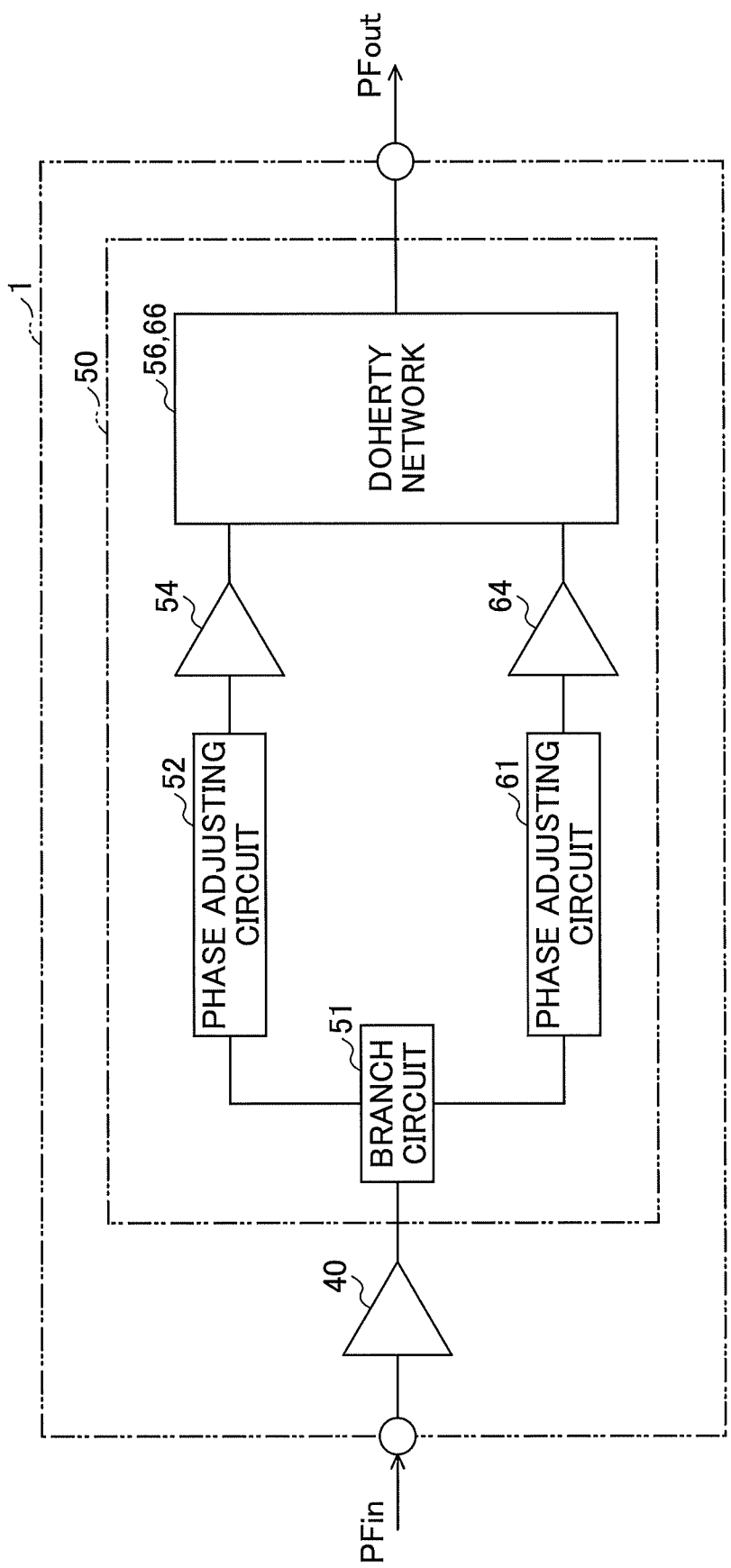
FIG. 2 is a block diagram illustrating a high frequency amplifier of FIG. 1.
Figure 4:
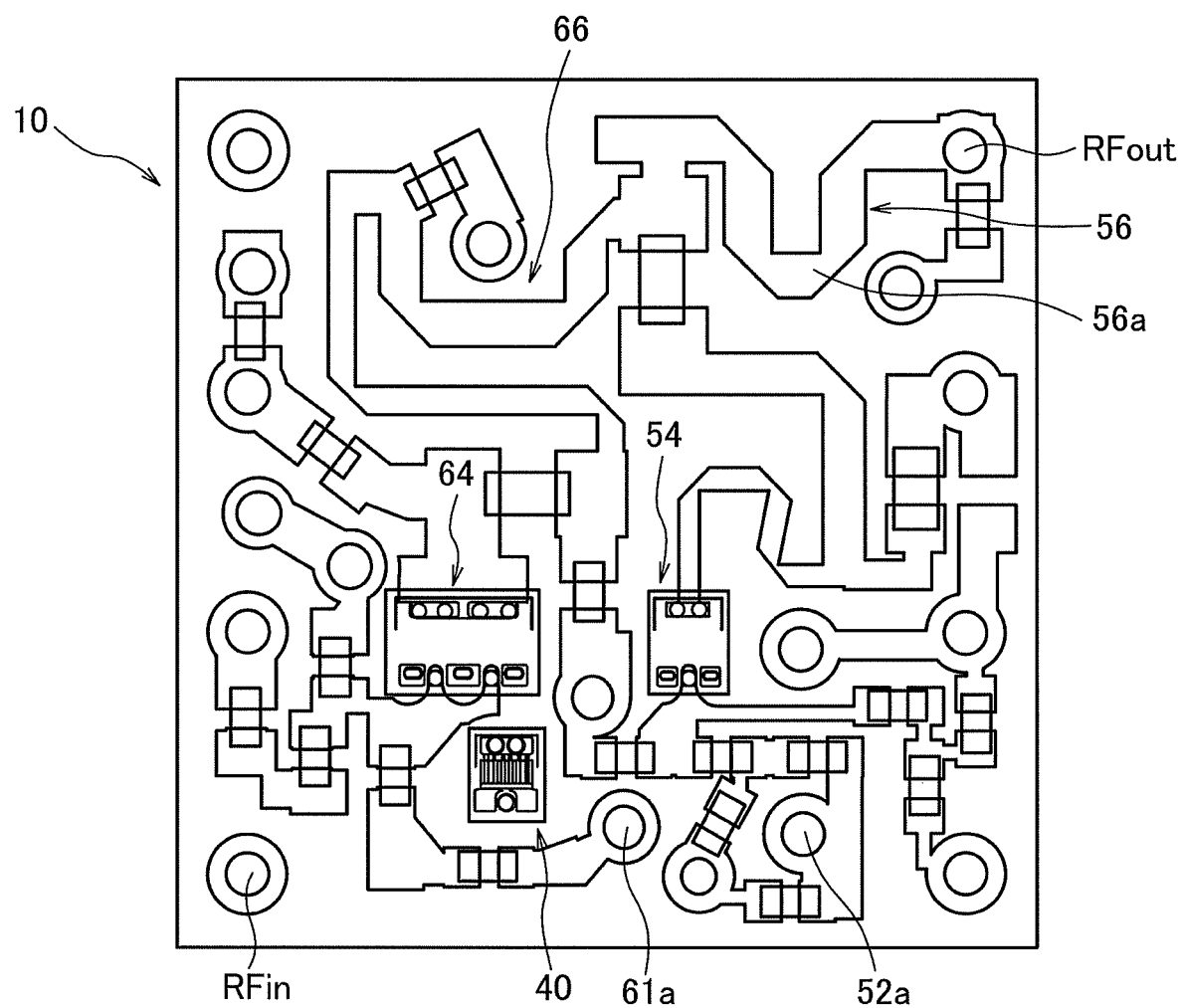
FIG. 4 is a plan view of the lower stage of FIG. 1.

FIG. 2 is a block diagram illustrating a high frequency amplifier of FIG. 1. FIG. 3 is a plan view of the upper stage of FIG. 1. FIG. 4 is a plan view of the lower stage of FIG. 1. The high frequency amplifier 1 includes the driver amplifier 40 and the Doherty amplifier 50 provided in a subsequent stage of the driver amplifier 40, and is configured to amplify signals in a frequency band of 5 GHz to 6 GHz, for example. The electric circuit including the driver amplifier 40 amplifies the RF signal, which is input to the input terminal RFin and has a wavelength λ, to such an extent that the Doherty amplifier 50 can amplify the RF signal to a predetermined transmission power.

The Doherty amplifier 50 is an electric circuit including the branch circuit 51, the phase adjusting circuits 52 and 61, the carrier amplifier 54, the peak amplifier 64, and Doherty networks 56 and 66, and further amplifies the RF signal amplified by the driver amplifier 40 to output the amplified RF signal from the output terminal RFout. The driver amplifier 40, the carrier amplifier 54, the peak amplifier 64 are amplifiers using, for example, GaN-HEMT (High Electron Mobility Transistor) as an amplifying device. In each of the driver amplifier 40, the carrier amplifier 54, and the peak amplifier 64, a gate pad is provided on one side of a rectangular shape, and a drain pad is provided on the side facing the gate pad.

Each of the driver amplifier 40, the carrier amplifier 54, and the peak amplifier 64 is provided with source pads on both sides of the gate pad. The source pads of the driver amplifier 40, the carrier amplifier 54, and the peak amplifier 64 are connected to the base member La4 through the rear surfaces 40b, 54b, and 64b described with reference to FIG. 1. As a result, grounding (GND) is ensured, and the heat dissipation paths from the driver amplifier 40, the carrier amplifier 54, and the peak amplifier 64 to the base member La4 are formed, respectively.

The upper stage 20 shown in FIG. 3 and the lower stage 10 shown in FIG. 4 have substantially similar planar surfaces, and are each formed with a size of 6 mm square, for example. The RF signal input to the input terminal RFin (signal via 13a) through a signal wiring 101a provided on the printed circuit board 100 of the communication device as shown in FIG. 1 passes through the lower stage 10 from the base member La4 shown in FIG. 1. The RF signal passes through the signal vias 13a, 13b, and 13c shown in FIG. 1 without being connected anywhere in the lower stage 10, and is input to the lower left corner portion of the upper stage 20 as viewed in FIG. 3. The driver amplifier 40 is mounted near the lower left of the lower stage 10 as viewed in FIG. 4. The RF signal input to the upper stage 20 goes to the lower stage 10 through the signal via 15a, and the RF signal is input to the driver amplifier 40. The RF signal amplified by the driver amplifier 40 goes to the upper stage 20 through the signal via 15b, and the RF signal is largely turned as shown by the curved pattern 49 in FIG. 3. Specifically, the RF signal goes to the right along the upper side after going toward the upper side of the upper stage 20 as viewed in FIG. 3. Thereafter, the RF signal turns further to the right to go to the lower side of the upper stage 20, and the RF signal reaches the branch circuit 51 provided in the upper stage 20.

The branch circuit 51 is provided on the first wiring layer La1 in the upper stage 20. The branch circuit 51 is a Wilkinson-type divider, for example. The branch circuit 51 equally divides the RF signal amplified by the driver amplifier 40 into an input path of the peak amplifier and an input path of the carrier amplifier. One (input path of the carrier amplifier) of the RF signals distributed by the branch circuit 51 reaches the phase adjusting circuit 52 provided on the first wiring layer La1 in the upper stage 20. The phase adjusting circuit 52 delays the phase of the input signal of the carrier amplifier 54 by an amount corresponding to a predetermined distributed constant. The RF signal, after passing through the phase adjusting circuit 52, goes from a via 52a formed in the vicinity of the lower side of the upper stage 20 as viewed in FIG. 3 to the lower stage 10. This RF signal passes through a path similar to the signal path through the signal via 14a shown in FIG. 1, for example.

On the other hand, the other (input path of the peak amplifier) of the RF signals distributed by the branch circuit 51 reaches the phase adjusting circuit 61 provided on the first wiring layer La1 in the upper stage 20. The phase adjusting circuit 61 delays the phase of the input signal of the peak amplifier 64 by an amount corresponding to a predetermined distributed constant. The RF signal, after passing through the phase adjusting circuit 61, goes from a via 61a formed in the vicinity of the lower side of the upper stage 20 as viewed in FIG. 3 to the lower stage 10. This RF signal also passes through a path similar to the signal path through the signal via 14a shown in FIG. 1.

In the present embodiment, the phase adjusting circuit 52 is disposed between the branch circuit 51 and the carrier amplifier 54, and the phase adjusting circuit 61 is disposed between the branch circuit 51 and the peak amplifier 64. However, the present disclosure is not limited to this example. For example, a phase adjusting circuit can be disposed either between the branch circuit 51 and the peak amplifier 64, or between the branch circuit 51 and the carrier amplifier 54 to delay the phase of an input signal.

The Doherty amplifier 50 of the present embodiment is an asymmetrical Doherty amplifier in which the peak amplifier 64 and the carrier amplifier 54 have different maximum output intensities with respect to input RF signals. For example, the peak amplifier 64 may have a saturation output (size) that is about twice as large as that of the carrier amplifier 54, and the peak amplifier 64 initiates amplifying when the output power of the carrier amplifier 54 reaches the saturation region. Specifically, the carrier amplifier 54 operates in class AB or class B. The peak amplifier 64 operates in class C. For a low instantaneous power, the carrier amplifier 54 operates while the peak amplifier 64 does not operate. This allows an improved power efficiency. For a large instantaneous power, both of the carrier amplifier 54 and the peak amplifier 64 operate, so that the saturated power can be increased while maintaining a high power efficiency.

Examples of output powers of the driver amplifier 40, the carrier amplifier 54, and the peak amplifier 64 will be described. Amplifiers with an output of 10 W for the driver amplifier 40, an output of 15 W for the carrier amplifier 54, and an output of 30 W for the peak amplifier 64 may be used, respectively. Here, for example, the output power of 10 W solely represents the size of a FET (Field Effect Transistor), and means that the FET does not output 10 W at all times, but has a size sufficient for outputting a power of 10 W.

The RF signal amplified by the carrier amplifier 54 reaches a Doherty network 56 (for the carrier amplifier) provided in the lower stage 10. This Doherty network 56 is provided with a 90-degree transmission line 56a (also referred to as V4 line). Therefore, the RF signal amplified by the carrier amplifier 54 is combined with the output signal of the peak amplifier 64 described later and is output, through the 90-degree transmission line 56a, from the output terminal RFout provided in the upper right corner portion of the lower stage 10 as viewed in FIG. 4.

On the other hand, the RF signal amplified by the peak amplifier 64 reaches a Doherty network 66 (for the peak amplifier) provided in the lower stage 10. The RF signal is then combined with the output signal of the carrier amplifier 54, passes through a signal path through the signal via 16a shown in FIG. 1, and is output from the output terminal RFout. The signal output from the output terminal RFout is propagated from the high frequency amplifier 1 to the outside through a signal wiring 101b provided on the printed circuit board 100 of the communication device as shown in FIG. 1.

Figure 5:
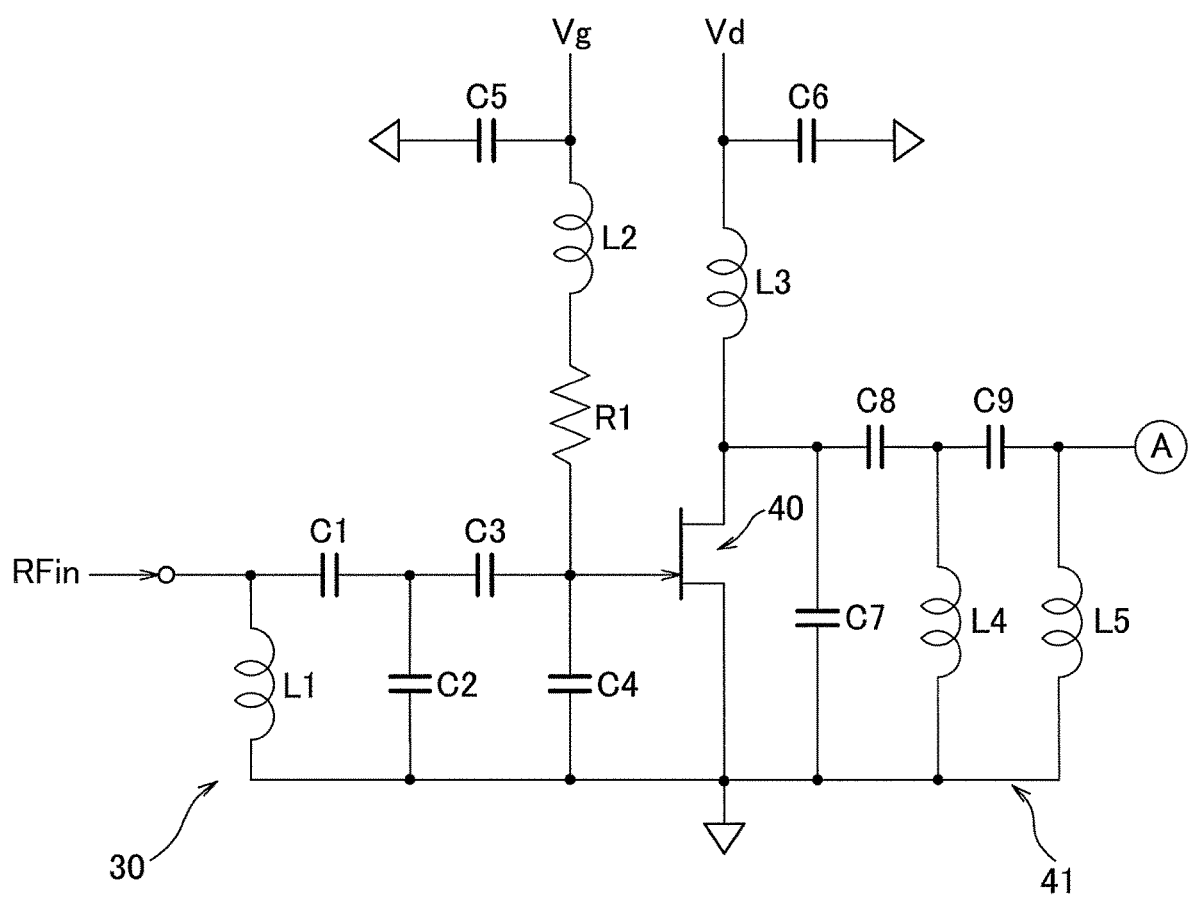
FIG. 5 is a circuit diagram of a driver amplifier of FIG. 1.
Figure 6:
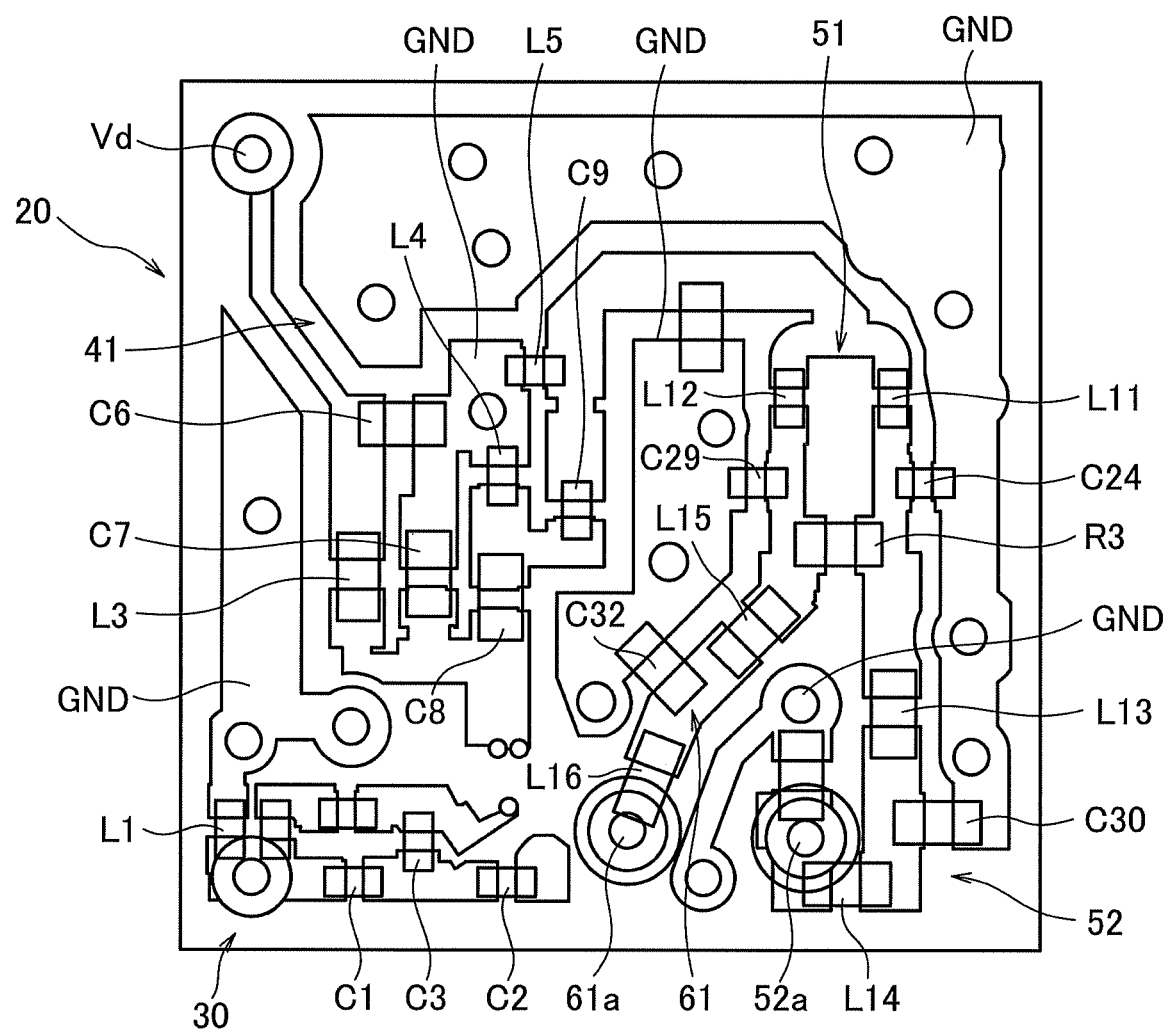
FIG. 6 is a diagram for explaining the upper stage corresponding to the circuit diagram of FIG. 5.
Figure 7:
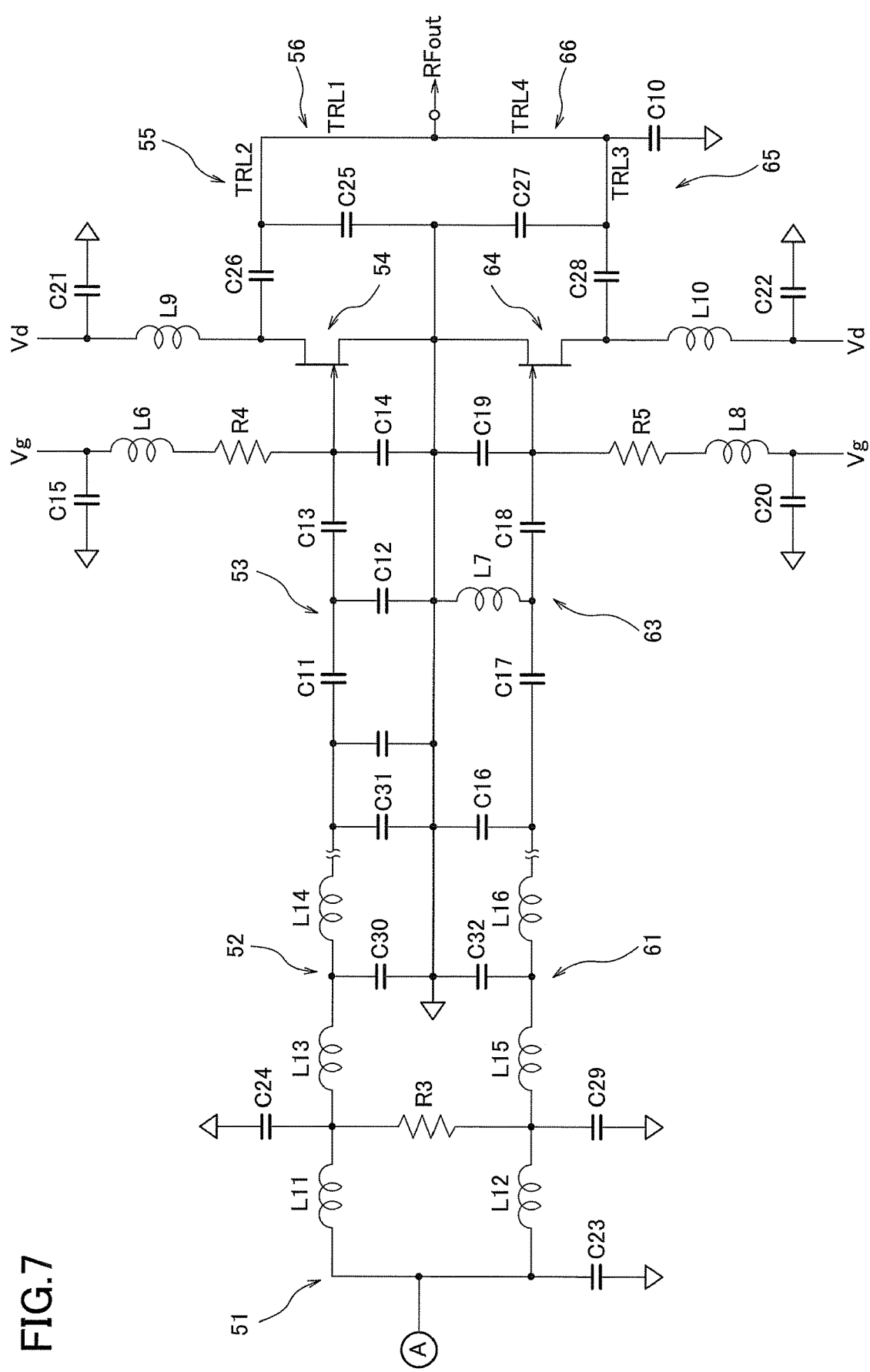
FIG. 7 is a circuit diagram of a Doherty amplifier of FIG. 1.
Figure 8:
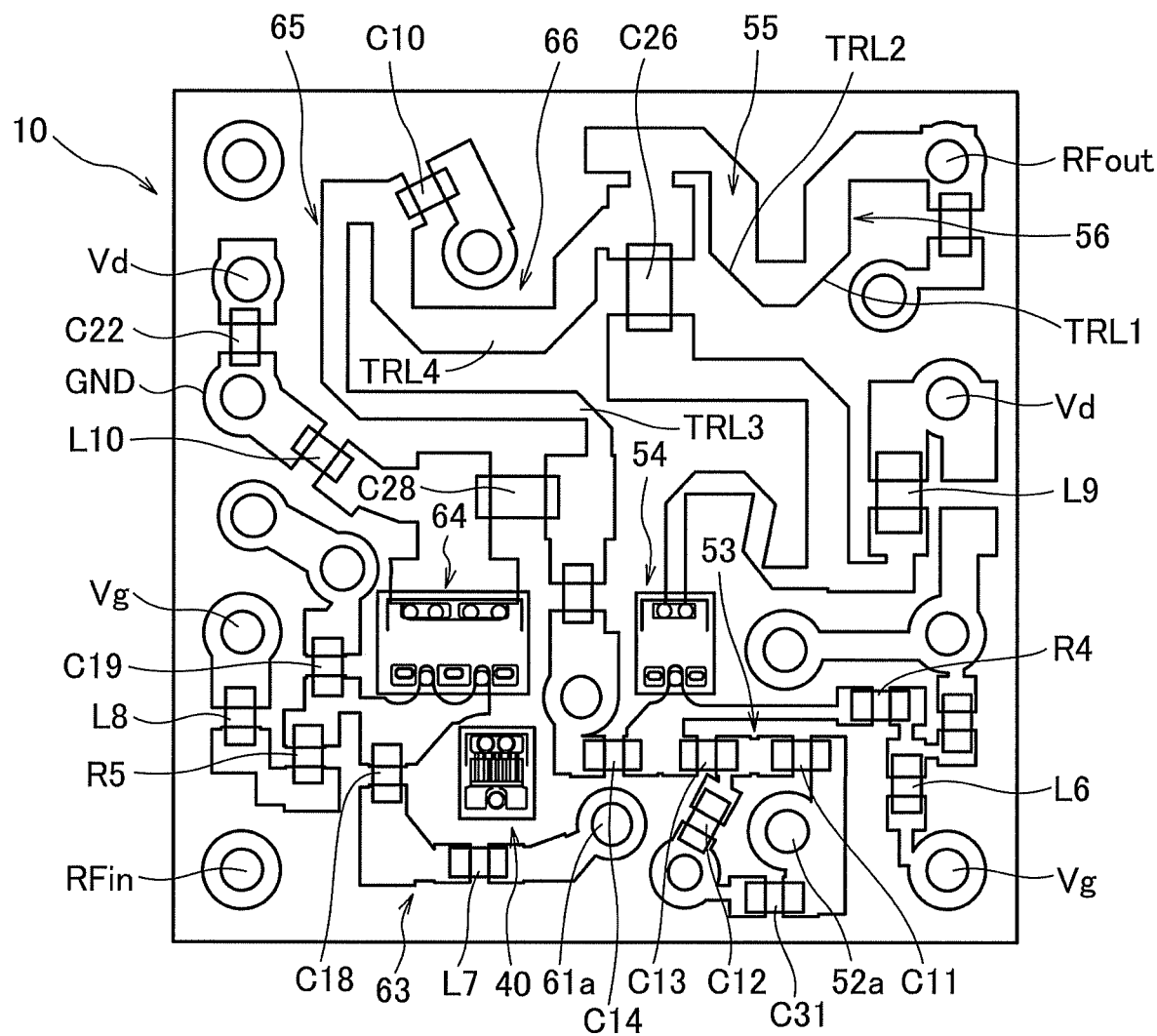
FIG. 8 is a diagram for explaining the lower stage corresponding to the circuit diagram of FIG. 7.

FIG. 5 is a circuit diagram for the driver amplifier of FIG. 1. FIG. 6 is a diagram for explaining the upper stage corresponding to the circuit diagram of FIG. 5. FIG. 7 is a circuit diagram for the Doherty amplifier of FIG. 1. FIG. 8 is a diagram for explaining the lower stage corresponding to the circuit diagram of FIG. 7. The RF signal input from the input terminal RFin shown in FIG. 5 is input to the gate of the driver amplifier 40 (disposed in the lower stage 10) through an input matching circuit 30 (disposed in the upper stage and including five elements of an inductor L1 and capacitors C1 to C4). A gate bias is supplied from a power source Vg through an inductor L2. A capacitor C5 is a bypass capacitor of the power source Vg, and a resistor R1 is a resistor for adjustment.

A drain output of the driver amplifier 40 is provided to the branch circuit 51 through an output matching circuit 41 (inductors L4 and L5 and capacitors C7 to C9). A drain bias is supplied from a power source Vd through an inductor L3. A capacitor C6 is a bypass capacitor of the power source Vd. Next, as shown in FIG. 7, in the branch circuit 51, the RF signal from the driver amplifier 40 is equally divided into a matching circuit including an inductor L11 and a capacitor C24, and a matching circuit including a capacitor C23, an inductor L12, and a capacitor C29.

The RF signal whose phase is adjusted by the matching circuit including an inductor L11 and a capacitor C24 is further adjusted in phase by the phase adjusting circuit 52 (inductors L13 and L14 and a capacitor C30), and the RF signal reaches the lower stage 10 through the via 52a and goes to the carrier amplifier 54. The RF signal reaching the lower stage 10 is input to the gate of the carrier amplifier 54 through the input matching circuit 53 (capacitors C31 and C11 to C14). A gate bias is supplied from the power source Vg through an inductor L6. A capacitor C15 is a bypass capacitor of the power source Vg, and a resistor R4 is a resistor for adjustment.

A drain output of the carrier amplifier 54 is provided to a Doherty network 56 (for the carrier amplifier) through a capacitor C26 for DC cutoff. A drain bias is supplied from the power source Vd through an inductor L9. A capacitor C21 is a bypass capacitor of the power source Vd. The Doherty network 56 for the carrier amplifier includes an output matching circuit 55 having a transmission line TRL2 and a capacitor C25, and a transmission line TRL1 (including the 90-degree transmission line 56a described in FIG. 4) for combining the output of the carrier amplifier 54 and the output of the peak amplifier 64.

On the other hand, the RF signal which is divided equally by the branch circuit 51 and whose phase is adjusted by the matching circuit including the capacitor C23, the inductor L12, and the capacitor C29 is further adjusted in phase by the phase adjusting circuit 61 (inductors L15 and L16, and a capacitor C32). The RF signal then reaches the lower stage 10 through the via 61a and goes to the peak amplifier 64. The RF signal reaching the lower stage 10 is input to the gate of the peak amplifier 64 through the input matching circuit 63 (inductor L7 and capacitors C16 to C19). A gate bias is supplied from the power source Vg through an inductor L8. A capacitor C20 is a bypass capacitor of the power source Vg. A resistor R5 is a resistor for adjustment.

A drain output of the peak amplifier 64 is provided to a Doherty network 66 for the peak amplifier through a capacitor C28 for DC cutoff. A drain bias is supplied from the power source Vd through an inductor L10. A capacitor C22 is a bypass capacitor of the power source Vd. The Doherty network 66 for the peak amplifier includes a transmission line TRL4 and an output matching circuit 65a having a transmission line TRL3 and a two-stage configuration of a capacitor C27 and a capacitor C10.

Comparing the output powers of the aforementioned amplifiers, it is considered that the current consumption or power consumption and the magnitude of the resulting heat generation increases in the order of the driver amplifier 40, the carrier amplifier 54, and the peak amplifier 64. In the high frequency amplifier 1 according to this embodiment, each of the driver amplifier 40, the carrier amplifier 54, and the peak amplifier 64 is in contact with the base member La4 made of a metal such as copper. Therefore, the driver amplifier 40, the carrier amplifier 54 and the peak amplifier 64 can achieve an excellent heat dissipation. As a result, the high frequency amplifier 1 that is compact and has excellent heat dissipation properties can be provided.

Incidentally, when the driver amplifier 40, the carrier amplifier 54, and the peak amplifier 64 as described above with reference to FIG. 1 are disposed in the lower stage 10, for example, the input matching circuit 30 (inductor L1 and capacitors C1 to C4) of the above-described driver amplifier 40 may be disposed in the lower stage 10, and the input matching circuit 63 (inductor L7 and capacitors C16 to C19) of the peak amplifier 64 may be disposed in the upper stage 20.

FIG. 9 is a cross-sectional view schematically illustrating a high frequency amplifier according to another embodiment of the present disclosure. Components having the same functions as those in the high frequency amplifier 1 of FIG. 1 are denoted by the same reference numerals, and detailed descriptions thereof will be omitted. Also in a high frequency amplifier 1 shown in FIG. 9, a lower stage 10 and upper stage 20 are mounted on a base member La4. A driver amplifier 40, a carrier amplifier 54 and a peak amplifier 64 are each provided in a first dielectric layer 11. Each of rear surfaces 40b, 54b and 64b of the driver amplifier 40, the carrier amplifier 54 and the peak amplifier 64 is disposed to face downward so as to be in contact with the base member La4, and is fixed to the base member La4.

The electric path between a third wiring layer La3 in the lower stage 10 and the base member La4 is secured using a signal via 13a. The signal via 13a penetrates the base member La4 and the first dielectric layer 11 in the lower stage 10. One end of the signal via 13a is connected to an input terminal RFin, and the other end of the signal via 13a is connected to a third wiring layer La3. The electric path between the third wiring layer La3 and the first dielectric layer 11 in the upper stage 20 is also secured using signal vias 15b and 14a. Specifically, the signal via 15b penetrates a fourth dielectric layer 24 in the upper stage 20 and a second dielectric layer 12 in the lower stage 10. One end of the signal via 15b is connected to the output of the driver amplifier 40 through the third wiring layer La3, and the other end of the signal via 15b is connected to a first wiring layer La1.

The signal via 14a also penetrates the fourth dielectric layer 24 in the upper stage 20 and the second dielectric layer 12 in the lower stage 10. One end of the signal via 14a is connected to the first wiring layer La1, and the other end of the signal via 14a is connected to the input of the carrier amplifier 54 and the input of the peak amplifier 64 through the third wiring layer La3. For the electric path between the third wiring layer La3 in the lower stage 10 and the base member La4, a signal via 17a that penetrates the first dielectric layer 11 is used.

Further, the electric path between the third wiring layer La3 and the base member La4 are secured using signal vias 13a and 16a. The signal vias 13a and 16a penetrate the first dielectric layer 11 in the lower stage 10 and the base member La4. One end of the signal via 16a is connected to the output of a Doherty amplifier 50 through the third wiring layer La3, and the other end of the signal via 16a is connected to an output terminal RFout. Also in the high frequency amplifier 1 shown in FIG. 9, the phase difference between the RF signal at the output terminal of the driver amplifier 40 and the RF signal at the input terminal of the peak amplifier 64 is from $11\pi/2$ to $13\pi/2$.

The RF signal input to the input terminal RFin (signal via 13a) through a signal wiring 101a is input to the third wiring layer La3 in the lower stage 10. Thereafter, the RF signal is input to the driver amplifier 40 through an input matching circuit 30 provided in the lower stage 10. The RF signal amplified by the driver amplifier 40 passes through the signal via 15b to the upper stage 20, and the RF signal reaches a branch circuit 51 provided in the upper stage 20. One (input path of the carrier amplifier) of the RF signals distributed by the branch circuit 51 reaches a phase adjusting circuit 52 in which the phase of the input signal of the carrier amplifier 54 is delayed by an amount corresponding to a predetermined distributed constant. The RF signal, after passing through the phase adjusting circuit 52, passes through a path similar to the signal path through the signal via 14a to the lower stage 10 and is input to the carrier amplifier 54. The RF signal amplified by the carrier amplifier 54 reaches a Doherty network 56 for the carrier amplifier provided in the lower stage 10, and is combined with the output signal of the peak amplifier 64 to be described later.

On the other hand, the other (input path of the peak amplifier) of the RF signals distributed by the branch circuit 51 reaches a phase adjusting circuit 61 in which the phase of the input signal of the peak amplifier 64 is delayed by an amount corresponding to a predetermined distributed constant. The RF signal, after passing through the phase adjusting circuit 61, passes through an input matching circuit 63 provided in the upper stage 20 and then passes through a path similar to the signal path through the signal via 14a to the lower stage 10, where the RF signal is input to peak amplifier 64. The RF signal amplified by the peak amplifier 64 reaches a Doherty network 66 for the peak amplifier, and is combined with the output signal of the carrier amplifier 54. The RF signal then passes through the signal path through the signal via 16a to be output from the output terminal RFout. The signal output from the output terminal RFout passes through the signal wiring 101b and propagates from the high frequency amplifier 1 to the outside.

The embodiments of the present disclosure have been described above. However, the embodiments of the present disclosure disclosed above are only illustrative, and the scope of the present invention is not limited to the specific embodiments of the disclosure. It is to be understood that the scope of the present invention is defined in the appended claims and includes equivalence of the description of the claims and all changes within the scope of the claims.

What is claimed is:

1. A high frequency amplifier comprising:
   an asymmetrical Doherty amplifier that includes a carrier amplifier, a peak amplifier, a branch circuit, and a phase adjusting circuit, and is configured to amplify an input high frequency signal;
   a driver amplifier configured to drive the asymmetrical Doherty amplifier;
   a first circuit board mounting the driver amplifier, the carrier amplifier, and the peak amplifier;
   a second circuit board mounting the branch circuit and the phase adjusting circuit; and
   a base member mounting the first circuit board and the second circuit board,
   wherein the peak amplifier has a saturation output different from a saturation output of the carrier amplifier and is configured to initiate an amplifying operation when an output of the carrier amplifier reaches a saturation region,
   the branch circuit is configured to divide a path of a high frequency signal amplified by the driver amplifier into input paths of the peak amplifier and the carrier amplifier,
   the phase adjusting circuit is provided on at least one of the input paths of the peak amplifier and the carrier amplifier to delay at least one of phases of input signals of the peak amplifier and the carrier amplifier,
   the driver amplifier, the carrier amplifier, and the peak amplifier each include a front surface having a circuit thereon and a rear surface opposite to the front surface,
   each of the rear surfaces of the driver amplifier, the carrier amplifier, and the peak amplifier is in contact with the base member,
   the second circuit board is stacked on the first circuit board,
   an input terminal of the driver amplifier and an input terminal of the peak amplifier are adjacent to each other, and
   an electrical length from an output terminal of the driver amplifier to the input terminal of the peak amplifier, when converted based on a phase of the input high frequency signal, is from $(2n+1)\times\pi-\pi/4$ to $(2n+1)\times\pi+\pi/4$, where n is an integer greater than or equal to zero.

2. The high frequency amplifier according to claim 1, wherein a phase difference between a high frequency signal at the output terminal of the driver amplifier and a high frequency signal at the input terminal of the peak amplifier is from $11\pi/4$ to $13\pi/4$.

3. The high frequency amplifier according to claim 1, wherein a grounded metal layer is disposed between the first circuit board and the second circuit board.

4. The high frequency amplifier according to claim 1, wherein the saturation output of the peak amplifier is larger than the saturation output the carrier amplifier.

* * * * *